(12) United States Patent
Probst et al.

(10) Patent No.: US 8,082,878 B2
(45) Date of Patent: Dec. 27, 2011

(54) THERMAL EVAPORATION APPARATUS, USE AND METHOD OF DEPOSITING A MATERIAL

(75) Inventors: Volker Probst, Berlin (DE); Walter Stetter, Munich (DE)

(73) Assignee: Saint-Gobain Glass France, Courbevoie (FR)

( * ) Notice: Subject to any disclaimer, the term of this patent is extended or adjusted under 35 U.S.C. 154(b) by 609 days.

(21) Appl. No.: 12/297,527

(22) PCT Filed: Apr. 20, 2007

(86) PCT No.: PCT/EP2007/053912
§ 371 (c)(1),
(2), (4) Date: Oct. 17, 2008

(87) PCT Pub. No.: WO2007/122203
PCT Pub. Date: Nov. 1, 2007

(65) Prior Publication Data
US 2009/0130794 A1 May 21, 2009

(30) Foreign Application Priority Data

Apr. 20, 2006 (EP) .................................... 06112796

(51) Int. Cl.
*C23C 16/448* (2006.01)
*C23C 16/44* (2006.01)
*C23C 16/455* (2006.01)
*C10J 1/00* (2006.01)
*B01J 38/04* (2006.01)
*C23F 1/00* (2006.01)
*H01L 21/306* (2006.01)
*C23C 16/06* (2006.01)

(52) U.S. Cl. ........ 118/723 VE; 122/5; 122/6 R; 502/34; 156/345.1

(58) Field of Classification Search ............ 118/723 VE; 122/5, 6 R; 502/34; 156/345.1
See application file for complete search history.

(56) References Cited

U.S. PATENT DOCUMENTS 2,621,296 A * 12/1952 Thompson .................... 250/425
(Continued)

FOREIGN PATENT DOCUMENTS

DE 10021530 9/2001
(Continued)

OTHER PUBLICATIONS

PCT Written Opinion issued for PCT Application No. PCT/EP2007/053912 filed Apr. 20, 2007 in the name of Shell Erneuerbare Energien GMBH.

(Continued)

*Primary Examiner* — Rudy Zervigon
(74) *Attorney, Agent, or Firm* — Steinfl & Bruno, LLP

(57) ABSTRACT

Thermal evaporation apparatus for depositing of a material on a substrate, comprising material storage means; heating means to generate a vapor of the material in the material storage means; vapor outlet means comprising a vapor receiving pipe having vapor outlet passages, and emission reducing means arranged such that an external surface of the vapor outlet means directed to said substrate exhibits low emission, and wherein the apparatus further comprises pipe heating means in the interior of said vapor outlet means, wherein at least the surfaces of the material storage means, heating means, and emission reducing means and pipe heating means arranged to come into contact with the material vapor are of a corrosion-resistant material. Further a thermal evaporation apparatus for depositing a material on a substrate comprising a vapor outlet means arranged to receive in its interior the vapor of the material heated in a material storage means and having vapor outlet passages, wherein said vapor outlet means basically consist of a corrosion-resistant material and are gastight to such an extent that sufficient dynamic pressure of said material vapor is achievable for homogenous deposition of said material on said substrate. Also the use of the apparatus, and a method of depositing a material onto a substrate by thermal evaporation.

9 Claims, 5 Drawing Sheets

U.S. PATENT DOCUMENTS

| | | | | |
|---|---|---|---|---|
| 2,624,845 | A * | 1/1953 | Thompson | 250/288 |
| 3,968,346 | A * | 7/1976 | Cooksley | 392/491 |
| 4,662,981 | A * | 5/1987 | Fujiyasu et al. | 117/93 |
| 4,854,264 | A * | 8/1989 | Noma et al. | 118/719 |
| 5,016,566 | A * | 5/1991 | Levchenko et al. | 118/726 |
| 5,019,531 | A * | 5/1991 | Awaya et al. | 438/605 |
| 5,284,519 | A * | 2/1994 | Gadgil | 118/719 |
| 5,303,671 | A * | 4/1994 | Kondo et al. | 118/719 |
| 5,433,791 | A * | 7/1995 | Brewer et al. | 118/724 |
| 5,462,014 | A * | 10/1995 | Awaya et al. | 118/725 |
| 5,551,984 | A * | 9/1996 | Tanahashi | 118/724 |
| 5,722,588 | A * | 3/1998 | Inoue et al. | 237/12.3 C |
| 6,004,885 | A * | 12/1999 | Hayakawa et al. | 438/758 |
| 6,036,783 | A * | 3/2000 | Fukunaga et al. | 118/724 |
| 6,110,283 | A * | 8/2000 | Yamamuka et al. | 118/715 |
| 6,148,764 | A * | 11/2000 | Cui et al. | 118/723 ME |
| 6,365,016 | B1 * | 4/2002 | Iacovangelo et al. | 204/192.38 |
| 6,367,414 | B2 * | 4/2002 | Witzman et al. | 118/723 VE |
| 6,397,936 | B1 * | 6/2002 | Crowley et al. | 165/104.26 |
| 6,475,563 | B2 * | 11/2002 | Hayakawa et al. | 427/248.1 |
| 6,575,178 | B1 * | 6/2003 | Kamikawa | 134/88 |
| 6,948,362 | B2 * | 9/2005 | Gralenski | 73/204.23 |
| 7,194,197 | B1 | 3/2007 | Wendt et al. | |
| 7,779,785 | B2 * | 8/2010 | Miya et al. | 118/723 I |
| 2001/0011524 | A1 * | 8/2001 | Witzman et al. | 118/718 |
| 2004/0163600 | A1 | 8/2004 | Hoffmann et al. | |
| 2005/0208216 | A1 | 9/2005 | Long et al. | 427/248.1 |
| 2007/0253686 | A1 | 11/2007 | Wendt et al. | 392/388 |
| 2009/0047204 | A1 * | 2/2009 | Kim et al. | 423/349 |

FOREIGN PATENT DOCUMENTS

| | | |
|---|---|---|
| EP | 1424404 | 6/2004 |
| GB | 2127315 | 4/1984 |
| WO | WO9942634 | 8/1999 |

OTHER PUBLICATIONS

International Search Report (PCT/EP2007/053912).

* cited by examiner

THERMAL EVAPORATION APPARATUS, USE AND METHOD OF DEPOSITING A MATERIAL

PRIORITY CLAIM

The present application claims priority of European US Patent Application No. 06112796.5 filed 20 Apr. 2006.

FIELD OF THE INVENTION

The present invention relates to a thermal evaporation apparatus for deposition of various kinds of thin films on a substrate at a high deposition rate and more particularly to improvements regarding such an apparatus leading to a higher durability of the thermal evaporation apparatus, especially when aggressive materials, such as Selenium (Se) are deposited.

BACKGROUND OF THE INVENTION

For example, in the process of manufacturing a Cu(In,Ga)(S,Se)$_2$ semiconductor layer of a CIS solar module, the method of thermal vapour deposition (hereinafter referred to as "TVD") is well established to deposit Selenium (Se) thin films on large surface substrates.

In industrial production processes for manufacturing devices comprising a thin film of thermal vapour deposited material several general requirements have to be observed. For example, in order to be effective, an industrial manufacturing process requires a sufficiently high deposition rate which can be achieved when the TVD is performed at high temperatures. A further requirement relates to durability of the apparatus employed for TVD. The former requirement contradicts the latter since higher temperatures lead to higher wear and a reduced life cycle of the apparatus. In addition, higher temperatures increase the risk of contaminations of the material to be deposited by means of TVD, especially when aggressive materials such as Selenium (Se) are to be deposited. Particularly, in the field of solar cell semiconductor CIS thin films such contaminations may cause impurity traps in the semiconductor deteriorating the performance. Finally, high corrosion attack due to high processing temperatures makes it difficult to achieve constancy in apparatus performance which is a further requirement of industrial manufacturing processes.

DE 100 21 530 C1 describes a vapour source with an elongated vapour outlet pipe and a heating rod provided coaxially in the interior of the vapour outlet pipe. The vapour source of DE 100 21 530 C1 is specifically designed for the manufacturing process of CIS thin film solar cells. The material to be deposited is heated in two crucibles whereby a vapour is generated and the vapour is supplied to the heated vapour outlet pipe comprising outlet openings through which the vapour escapes from the vapour source for being deposited on a substrate. It is mentioned in DE 100 21 530 C1 that several vapour sources can be used in a serial arrangement to deposit different materials in the manufacturing process of a CIS solar cell.

EP 1 424 404 A describes a thermal evaporation apparatus comprising an electrically heated melting crucible in which the material to be deposited is stored and melted to generate the vapour. The vapour is received in a vapour pipe comprising outlet openings allowing the vapour to escape from the vapour pipe. The vapour pipe is surrounded by a heater, and radiation reflectors are arranged in order to direct the heat provided by the heater to the vapour pipe.

There is a need for a thermal evaporation apparatus which is capable of depositing any material, including aggressive materials, such as Selenium (Se), at high deposition rates.

There is also a need for a thermal evaporation apparatus which can be operated at high temperatures up to and above 400° C., and even much higher, in order to achieve high deposition rates.

There is further a need for a thermal evaporation apparatus which is resistant to wear even at high temperatures and in the presence of aggressive materials such as Selenium (Se).

There is a still further need for a thermal evaporation apparatus which is specifically suited for being employed in the manufacturing process of CIS solar cells.

SUMMARY OF THE INVENTION

The invention provides a thermal evaporation apparatus for depositing a material on a substrate, the apparatus comprising material storage means for receiving the material to be deposited, wherein at least the surfaces of the material storage means arranged to come into contact with the material vapour are of a corrosion-resistant material, for example a material of the group consisting of but not being limited to quartz, fused silica, ceramic, graphite and carbon-fibre-enforced-carbon (CFC);

heating means for heating the material in the material storage means to generate a vapour of the material;

vapour outlet means arranged to receive in its interior the vapour of the material heated in said material storage means, said vapour outlet means comprising a vapour receiving pipe having vapour outlet passages, wherein at least the surfaces of the vapour receiving pipe arranged to come into contact with the material vapour are of a corrosion-resistant material, for example a material of the group consisting of but not being limited to quartz, fused silica, ceramic, graphite and carbon-fibre-enforced-carbon (CFC), and emission reducing means arranged such that an external surface of the vapour outlet means directed to said substrate exhibits low emission, wherein at least the surfaces of the emission reducing means arranged to come into contact with the material vapour are of a corrosion-resistant material, for example a material of the group consisting of but not being limited to fused silica and ceramic, and wherein the apparatus further comprises pipe heating means arranged in the interior of said vapour outlet means, preferably being a line shaped pipe heating means extending along or in parallel with a longitudinal axis of said vapour receiving pipe, said pipe heating means being provided with an outer corrosion-resistant surface arranged to come into contact with the material vapour and being formed of a corrosion-resistant material, for example a material of the group consisting of but not being limited to quartz, fused silica, ceramic, and graphite.

The above thermal evaporation apparatus is also described in claim 1. Advantageous embodiments are described in the subclaims.

The thermal evaporation apparatus allows to deposit aggressive materials, such as Selenium (Se), at high deposition rates. Surfaces of components that come in contact with the vapour are of a corrosion-resistant material.

A particular advantage is achieved by the emission reducing means, which allows to reduce the thermal emission of the vapour outlet means at least in a direction towards the substrate, so that heating of substrate by radiation from the vapour outlet means is reduced to an acceptable level and that the material reaching the substrate is not re-vaporized from the surface of the substrate, even if the vapour outlet means is operated at high temperatures such as above 350° C., 400° C., or higher than 400° C. The apparatus can with advantage be used in the manufacturing process of CIS solar cells, and in particular for depositing Selenium on a precursor of a CIS thin film. Such a precursor comprises a sequence of layers of different chemical composition, with constituents of the CIS layer to be formed. After deposition of Selenium, the precursor has to undergo thermal processing in order to form the CIS layer. During Selenium deposition, the temperature of the substrate with the precursor preferably does not exceed a certain maximum temperature. The maximum temperature is determined taking the sticking coefficient of Selenium into account, which sticking coefficient is a measure of the balance between deposition and re-evaporation. A suitable maximum temperature for Selenium deposition is 90 degrees C., preferably 80 degrees C., more preferably 70 degrees C.

The emission reducing means suitably exhibits low emission in that it includes or is made from a material having a low emissivity. Emissivity of a material is the ratio of energy radiated by the material to the energy radiated by a black body of the same temperature, and is typically denoted as $\epsilon$, a dimensionless number between 0 and 1. $\epsilon=1$ is a black body. Suitably the emissivity of the emission reducing means is 0.6 or less, preferably 0.5 or less, more preferably 0.3 or less. Of particular relevance is the emission and emissivity in the direction of the substrate during normal operation.

The thermal evaporation apparatus for depositing a material on a substrate according to another aspect of the invention comprises material storage means for receiving the material to be deposited, said material storage means consisting of a corrosion-resistant material, for example a material of the group consisting of but not being limited to quartz, fused silica, ceramic, graphite and carbon-fibre-enforced-carbon (CFC);

heating means for heating the material in the material storage means to generate a vapour of the material; and vapour outlet means arranged to receive in its interior the vapour of the material heated in said material storage means and having vapour outlet passages, wherein said vapour outlet means basically consist of a corrosion-resistant material, for example a material of the group consisting of but not being limited to quartz, fused silica, ceramic, graphite and carbon-fibre-enforced-carbon (CFC) and wherein said vapour outlet means are gastight to such an extent that sufficient dynamic pressure of said material vapour is achievable for homogenous deposition of said material on said substrate.

The above thermal evaporation apparatus is also described in claim 1. Advantageous embodiments are described in the subclaims.

A further advantage of the invention is that the vapour outlet is sufficiently gastight for the evaporation material, such as aggressive Se vapour. This also allows to build up sufficient dynamic pressure for homogenous deposition of the vapour material.

The invention is further directed to the use of a thermal evaporation apparatus of the invention for depositing a material on a substrate, in particular wherein the material is Selenium, and more in particular wherein the substrate comprises a precursor or precursor layers of a CIS layer.

The invention moreover provides a method of depositing a material onto a substrate by thermal evaporation, the method comprising providing a thermal evaporation apparatus comprising heatable material storage means for receiving the material to be deposited; and heatable vapour outlet means arranged to receive in its interior the vapour of the material heated in said material storage means and having vapour outlet passages;

selecting a maximum temperature of the substrate during thermal evaporation of the material;

providing emission reducing means for the vapour outlet means, which emission reducing means are arranged such that an external surface of the vapour outlet means directed to said substrate exhibits emission that is low enough such that the substrate will not be heated above the maximum temperature during thermal evaporation of the material; and operating the thermal evaporation apparatus including heating the material storage means and vapour outlet means so as to evaporate and deposit the material on the substrate.

The maximum temperature is selected taking a parameter related to re-evaporation of the deposited material from the substrate, such as a sticking coefficient, into account, and/or taking thermal stability of the substrate or part thereof into account.

In a particular embodiment the material is Selenium, and more in particular the substrate comprises a precursor or precursor layers of a CIS layer in thermal equilibrium, e.g. Cu, In, Ga, and/or binary layers such as Cu/Ga or In/Ga. The latter case is to be distinguished from CIS layer formation by co-evaporation of CIS constituents onto a hot substrate such as discussed for example in U.S. Pat. No. 7,194,197. In co-evaporation the substrate is kept at a much higher temperature than when depositing a layer on a CIS precursor, because CIS film formation takes place simultaneously with deposition. Therefore it is specific for the deposition on a CIS precursor layer that the thermal energy emitted by the evaporation apparatus towards the typically much colder substrate is an issue. In the method of the invention the substrate therefore preferably does not comprise a CIS precursor layer.

BRIEF DESCRIPTION OF THE DRAWINGS

In the following embodiments of the invention will be described in more detail and with reference to the drawings, wherein.

Where the same reference numerals are used in different Figures, they refer to the same or similar objects.

DETAILED DESCRIPTION OF THE INVENTION

Figure 1:
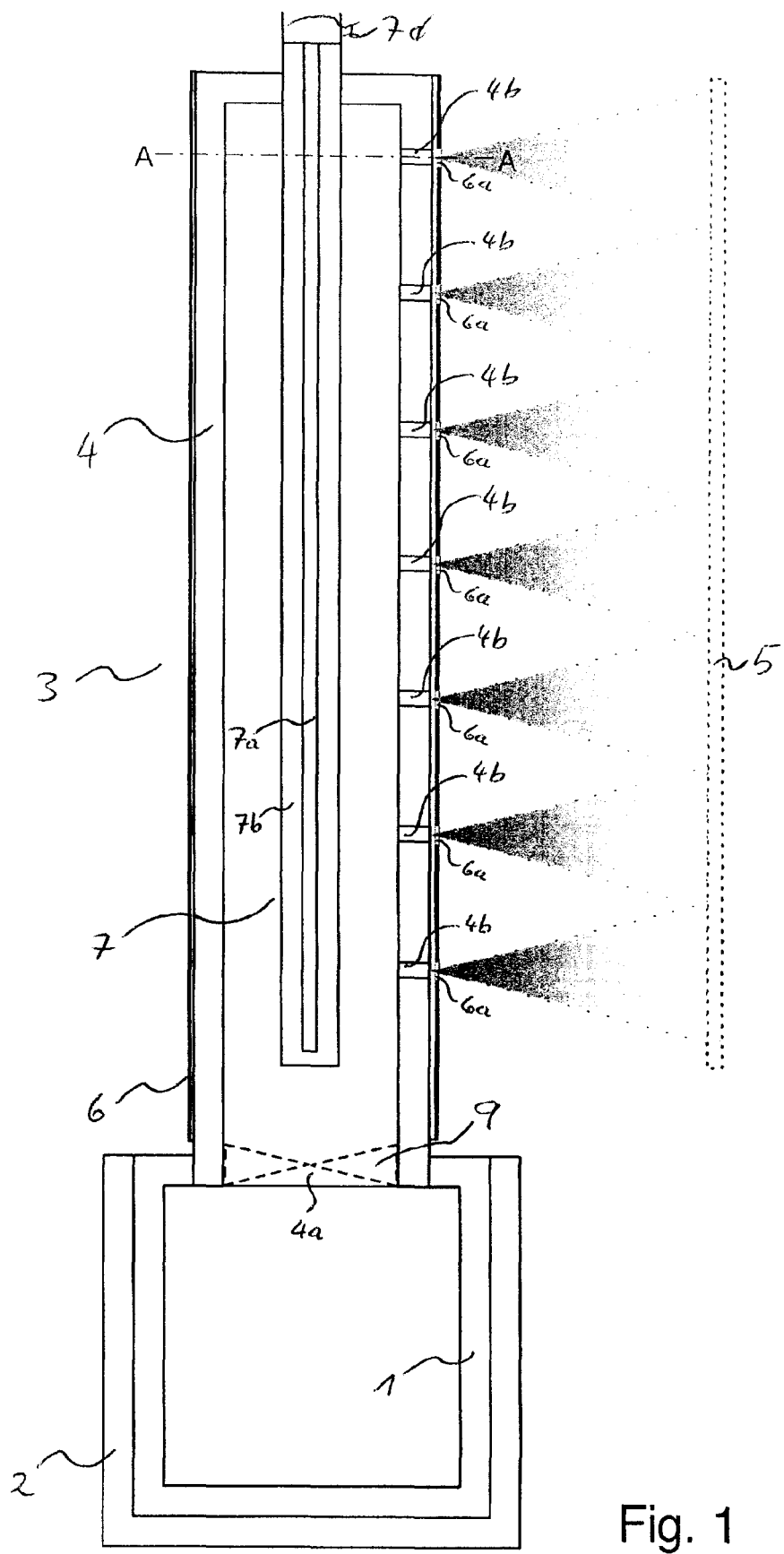
FIG. 1 shows a first embodiment of a thermal vapour deposition apparatus according to the invention.

Reference is made to FIG. 1. FIG. 1 shows a first embodiment of a thermal vapour deposition apparatus according to the invention allowing the deposition of a material on a substrate at a high rate. The apparatus of FIG. 1 comprises material storage means 1, which can for example be a melting crucible, for receiving the material to be melted and vaporized. The material storage means 1 is heatable by heating means 2, for example an electric heater, for heating the material stored in the material storage means 1 such that a vapour of the material is generated in the interior of the material storage means 1. The material storage means 1 can also be referred to as material storage container 1. The heating means 2 can also be referred to as heater 2.

The material storage means 1 comprises corrosion-resistant surfaces being arranged to come into contact with the material vapour. The corrosion-resistant surfaces can be provided by means of a corrosion-resistant material such as quartz, fused silica, ceramic, graphite or carbon-fibre-enforced-carbon (CFC). These materials are able to withstand aggressive materials, in particular Se and Se vapour. A suitable ceramic is $Al_2O_3$. Clearly, not only the surface but the entire wall or body of the material storage means can be of the corrosion-resistant material.

The apparatus shown in FIG. 1 further comprises vapour outlet means 3 which are arranged with respect to the material storage means 1 such that the vapour produced of the material stored in the material storage means 1 is received in the interior of the vapour outlet means 3. Preferably, the vapour outlet means 3 have an elongated cylindrical shape.

The vapour outlet means 3 comprise a vapour receiving pipe 4 which has an opening at one end 4a, forming an inlet for vapour of the vapour outlet means and vapour receiving pipe, such that the interior of the vapour receiving pipe 4 is in communication with the interior of the material storage means 1 to allow the material vapour to propagate from the material storage means 1 into the vapour outlet means 3. Preferably, the vapour receiving pipe 4 has an elongated cylindrical shape. As shown in FIG. 1, the vapour receiving pipe 4 comprises vapour outlet passages 4b allowing the material vapour to escape the vapour outlet means 3 in a direction towards a substrate 5 as indicated in FIG. 1 by means of grey triangles.

According to the invention, the vapour receiving pipe 4 comprises corrosion-resistant surfaces being arranged to come into contact with the material vapour. The surfaces, or in fact the entire wall or body of the vapour outlet means and vapour receiving pipe that are arranged to come into contact with the material vapour are made of corrosion-resistant material. The corrosion-resistant surfaces can be provided by means of a corrosion resistant material such as quartz, fused silica, ceramic, graphite or carbon-fibre-enforced-carbon (CFC).

The vapour outlet means 3 of the apparatus, according a specific and separate aspect of the invention, further comprise emission reducing means 6, for example an emission reducing pipe 6 as shown in FIG. 1 accommodating the vapour receiving pipe 4 in its interior, for reducing the emission of the vapour outlet means 4 at least in a direction towards the substrate 5. Due to the provision of said emission reducing means 6 the heating of substrate 5 by radiation from the vapour outlet means 3 is reduced such that the temperature of the substrate can be kept at an acceptable level and that the material reaching the substrate is not re-vaporized from the surface of the substrate. Preferably, the emission reducing means 6 have an elongated cylindrical shape.

The emission reducing means 6 comprises corrosion-resistant surfaces being arranged to come into contact with the material vapour. The corrosion-resistant surfaces can be provided by means of a corrosion-resistant material such as fused silica, ceramic.

By selecting a combination of materials for the vapour receiving pipe 4 and the emission reducing means 6 appropriate for a specific application, the vapour receiving pipe 4 and/or the emission reducing means 6 contribute to the gastightness of the vapour outlet means 3, however depending on the material selected to different extents. In any case, the material selection according to this aspect of the invention is performed such that the vapour receiving pipe 4 and/or the emission reducing means 6 cause the vapour outlet means 3 to be sufficiently gastight so that the gas pressure required for the material vapour to escape from the vapour outlet means 3 in order to propagate towards and reach the substrate 5 is obtained to a sufficient degree when the material is heated in the material storage means 1 of an apparatus according to the invention. The gastightness achieved according to a specific and separate aspect of the invention provides the vapour outlet means 3 with the capability to build up sufficient dynamic pressure for homogenous deposition of the vapour material.

The gastightness mentioned above can be observed, for example by comparing the amount of material vapour escaping through the vapour outlet passages 4b to the overall amount of material vapour generated in the thermal evaporation apparatus according to the invention. In a preferred embodiment, the vapour outlet means is arranged such that 75% or more of the material vapour that is produced in the material storage means escape from the vapour outlet means 3 through the vapour outlet passages 4b. According to the invention, the gastightness can be further increased such that 90% or more, or even at least 99% of the material vapour generated in an apparatus according the invention escape from the vapour outlet means 3 through the vapour outlet passages 4b. A particularly suitable material is high-density graphite, and coated CFC is another option.

The emission reducing means 6 are provided with vapour passage through holes 6a at locations aligned with the vapour outlet passages 4b of the vapour receiving pipe 4 so that the material vapour escaping from the vapour outlet means 3 through the vapour outlet passages 4b in the vapour receiving pipe 4 can propagate essentially unhindered towards the substrate 5. For this purpose, the diameter of the vapour passage through holes of the emission reducing means 6 is equal or greater than the diameter of the vapour outlet passages 4b of the vapour receiving pipe 4.

According to the invention, the apparatus shown in FIG. 1 further comprises pipe heating means 7, which in the embodiment shown is a line shaped pipe heating means arranged in the vapour receiving pipe 4 such that the longitudinal axes of the line shaped pipe heating means 7 and of the vapour receiving pipe 4 run parallel and preferably coincide. The line shaped heating means 7 heat the vapour outlet means 3 and prevent the material vapour in the interior of the vapour outlet means 3 to condensate and/or to form droplets.

In the embodiment shown in FIG. 1, the line shaped pipe heating means 7 comprise a heating element 7a and a heating element bulb (cover) 7b in which the heating element 7a is arranged. Of the heating element 7a and the heating element bulb 7b only the latter has an outer surface which faces the interior of the vapour receiving pipe 4 and which comes into contact with the material vapour.

According to the invention, the line shaped pipe heating means 7 comprise an outer corrosion-resistant surface, for example provided by means of the above mentioned heating element bulb 7b, wherein the corrosion-resistant surface is provided by means of a corrosion-resistant material such as quartz, fused silica, ceramic and graphite.

Advantageously, the line shaped heating means 7 is a tungsten halogenide IR heater, i.e. a tungsten halide lamp comprising electrical contacts, e.g. two electrical connectors 7d, for supplying electric energy to said tungsten halide lamp.

Figure 2:
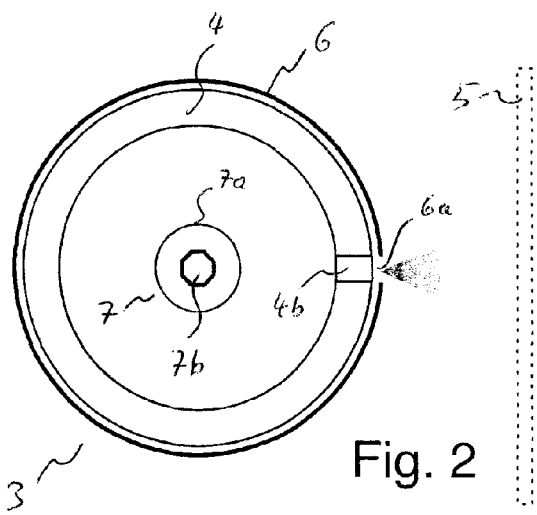
FIG. 2 shows a cross-sectional view of the first embodiment of a thermal vapour deposition apparatus according to the invention.

FIG. 2 shows a cross-sectional view of the vapour outlet means 3 at line A-A shown in FIG. 1. It is apparent from FIG. 2 that the emission reducing means 6 are arranged to surround the vapour receiving pipe 4 and that the vapour outlet passages 4b of the vapour receiving pipe 4 and vapour passage through holes 6a of the emission reducing means 6 are arranged to allow the vapour to escape from the interior of the vapour outlet means 3 through said passages, in particular they are aligned. As can be taken from FIG. 2, the vapour receiving pipe 4 and the emission reducing means 6 preferably have a cylindrical cross-section. It is further apparent that in the shown embodiment of the invention the vapour receiving pipe 4, the emission reducing means 6 and the line shaped pipe heating means 7 are arranged concentrically with respect to their longitudinal axes.

Figure 2A:
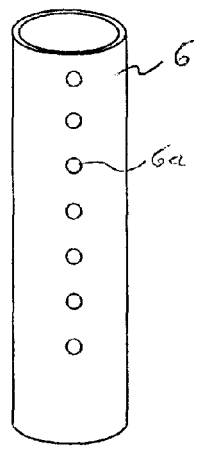
FIG. 2a shows a perspective view of a first variant of an emission reducing pipe of the first embodiment of a thermal vapour deposition apparatus according to the invention.
Figure 2B:
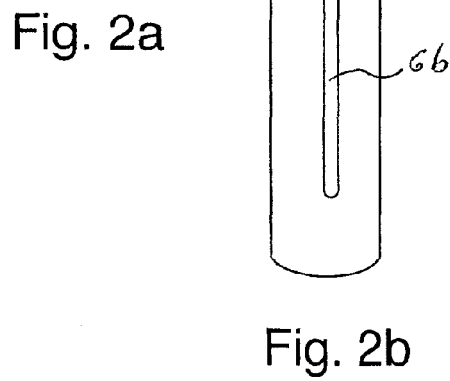
FIG. 2b shows a perspective view of a second variant of an emission reducing pipe of the first embodiment of a thermal vapour deposition apparatus according to the invention.

In FIG. 2a the emission reducing pipe 6 as described above is shown comprising individual vapour passage through holes 6a. It should be noted that instead of the individual vapour passage through holes 6a as described above the emission reducing means 6 may be provided with an elongated vapour passage slit 6b, as shown in FIG. 2b, which is aligned with the vapour outlet passages 4b of the vapour receiving pipe 4.

Figure 3:
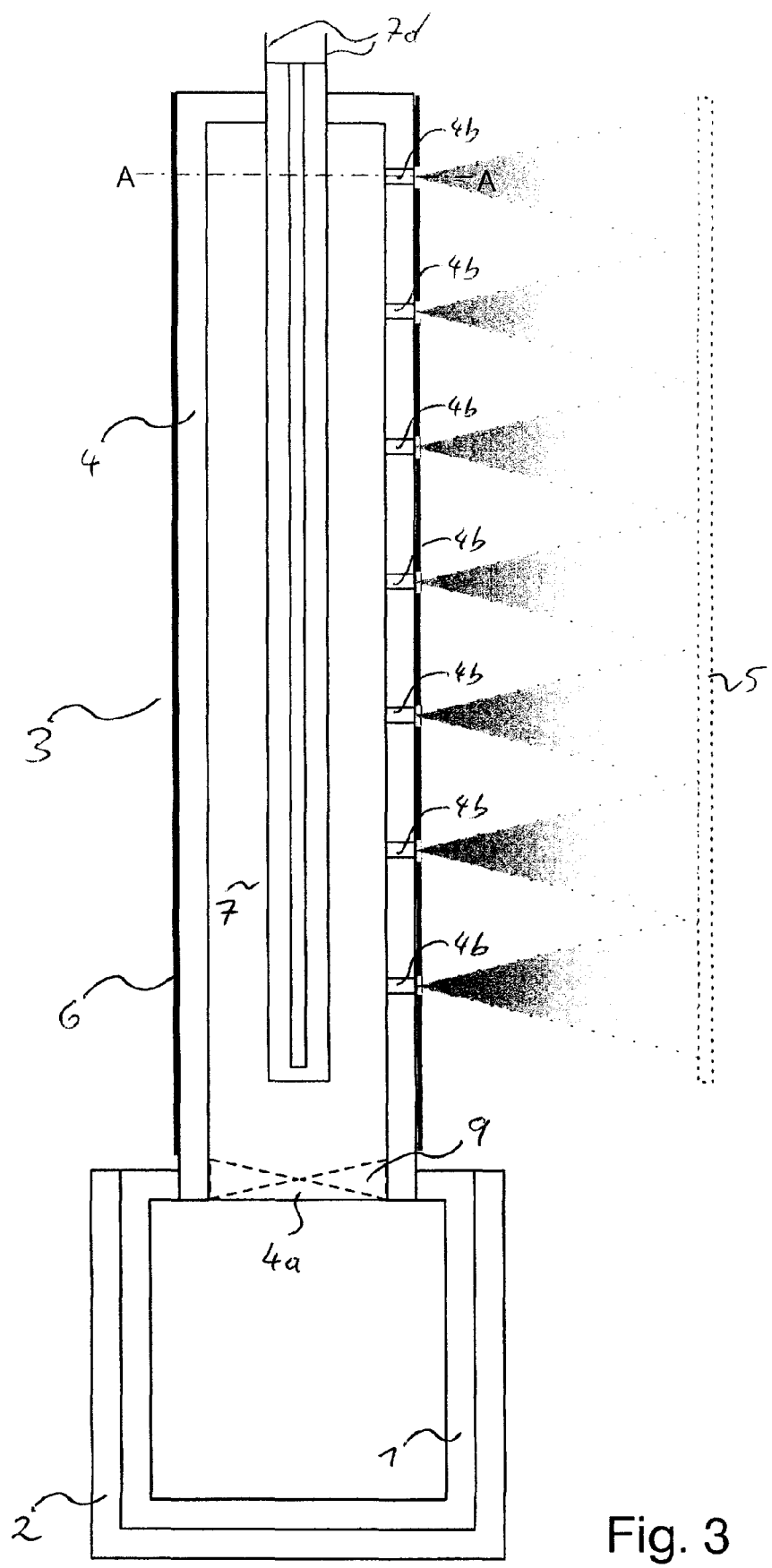
FIG. 3 shows a second embodiment of a thermal vapour deposition apparatus according to the invention.

FIG. 3 shows a second embodiment of a thermal vapour deposition apparatus according to the invention which is similar to the first embodiment in several aspects. Accordingly, the apparatus shown in FIG. 3 comprises material storage means 1 for receiving the material to be melted and vaporized and heating means 2 for heating the material stored in the material storage means 1. Further, the apparatus according to the second embodiment comprises vapour outlet means 3 which are arranged with respect to the material storage means 1 such that the vapour produced of the material stored in the material storage means 1 is received in the interior of the vapour outlet means 3. As shown in FIG. 3 the vapour outlet means 3 comprise a vapour receiving pipe 4 having an open end portion 4a and vapour outlet passages 4b allowing the material vapour to escape the vapour outlet means 3 in a direction towards a substrate 5. Line shaped pipe heating means 7 are provided in the vapour outlet means 3 as shown in FIG. 3. For further details of the second embodiment of the apparatus according to the invention reference is made to the above description of the first embodiment.

The second embodiment of the apparatus according to the invention also comprises emission reducing means 6 which are, however, provided by means of an emission reducing layer 6 on at least some portions of the surface of the vapour receiving pipe 4. The emission reducing layer 6 is arranged such that the vapour outlet passages 4b of the vapour receiving pipe 4 are left open so that the vapour is not hindered from escaping from the interior of the vapour outlet means 3 in the apparatus according to the second embodiment of the invention as shown in FIG. 3.

Figure 4:
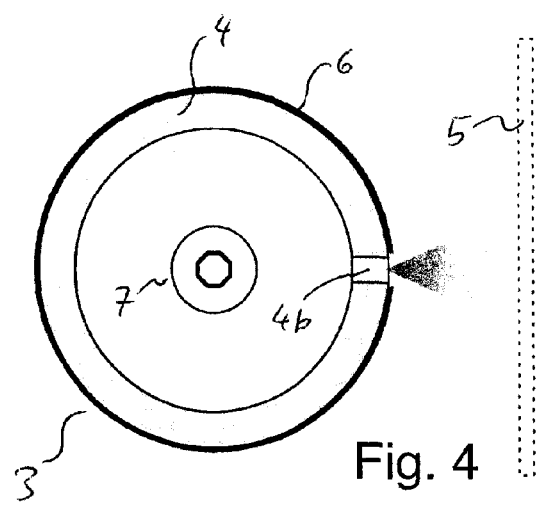
FIG. 4 shows a cross-sectional view of the second embodiment of a thermal vapour deposition apparatus according to the invention.

FIG. 4 is a cross-sectional view of the vapour outlet means 3 at line A-A shown in FIG. 3. It is apparent from FIG. 4 that in the second embodiment of the apparatus according to the invention the emission reducing layer 6 is arranged on the surface of the vapour receiving pipe 4 and that the vapour outlet passages 4b are open for the material vapour to pass through.

Figure 5:
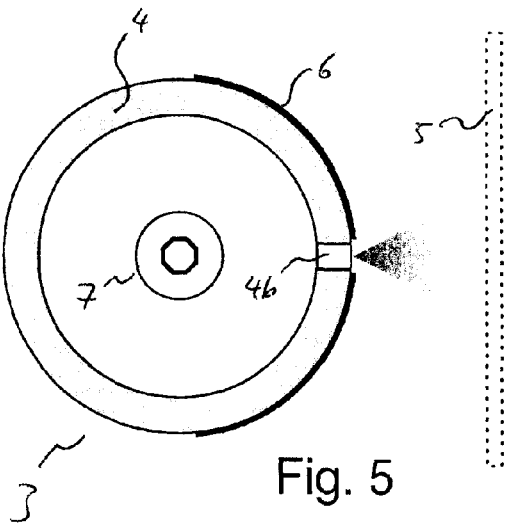
FIG. 5 shows a cross-sectional view of an alternative arrangement of the emission reducing means of any of the embodiments of a thermal vapour deposition apparatus according to the invention.

FIG. 5 shows an alternative arrangement of the emission reducing layer 6 of the second embodiment. The principle of the alternative arrangement is, however, applicable to the emission reducing means of any embodiment of the invention. As is apparent from FIG. 5, the emission reducing layer 6 according to the alternative arrangement is provided only on a portion of the surface of the vapour receiving pipe 4 such that the surface portion of the vapour outlet means 3 facing the substrate 5 is covered by the emission reducing layer 6.

Figure 6:
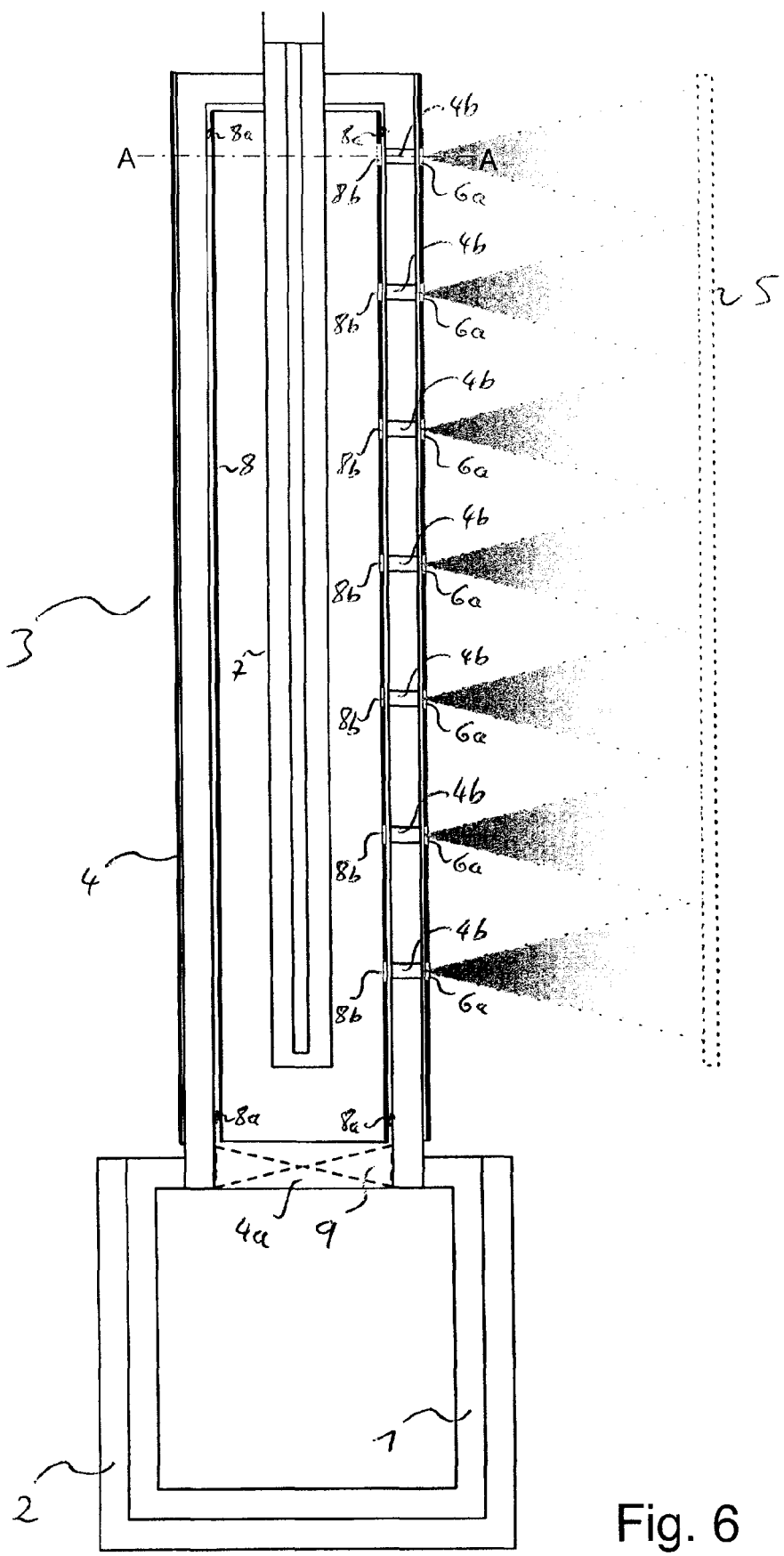
FIG. 6 shows a third embodiment of a thermal vapour deposition apparatus according to the invention.

FIG. 6 shows a third embodiment of the apparatus according to the invention. The apparatus according to the third embodiment comprises all features of the apparatus according to the first embodiment so that reference is made to the respective description above. However, according to the third embodiment, the apparatus further comprises radiation absorbing means 8 which are provided to absorb the heating radiation emitted by the line shaped pipe heating means 7 and to achieve an improved efficiency by keeping the energy in the vapour outlet means 3 to heat the material vapour. To achieve the desired increase in efficiency, the absorption rate and in particular absorption coefficient of the radiation absorbing means 8 is higher than the absorption rate and in particular absorption coefficient of the vapour receiving pipe 4, respectively, and preferably exceeds 50%. The radiation absorbing means is provided in the interior of the vapour outlet means and vapour outlet pipe.

The radiation absorbing means 8 are especially advantageous if the material of the vapour receiving pipe 4 is transparent to the radiation of the heating means to such an extent that the heating radiation emitted by the heating means of the vapour outlet means, such as line shaped pipe heating means 7, may substantially pass the vapour receiving pipe 4. For example, if the vapour receiving pipe 4 is manufactured of a material such as quartz, the radiation absorbing means are made of a material such as CFC, graphite, TiN or SiN are particularly advantageous. The radiation absorbing means then absorbs the radiation energy from the heating means transmits thermal energy by radiating itself at different wavelengths that can be absorbed by the vapour receiving pipe, and/or by thermal conduction. Generally, according to the invention, the radiation absorbing means 8 comprises corrosion-resistant surfaces being arranged to come into contact with the material vapour. The corrosion-resistant surfaces can be provided by means of a corrosion-resistant material such as ceramic, TiN, SiN, graphite or carbon-fibre-enforced-carbon (CFC).

As shown in FIG. 6, the radiation absorbing means 8 may be provided by means of a radiation absorbing pipe 8 which is arranged in the interior of the vapour receiving pipe 4 of the vapour outlet means 3. The radiation absorbing pipe 8 may be in extensive contact with the vapour receiving pipe 4 or may be haltered such that the contact between the radiation absorbing pipe 8 and the vapour receiving pipe 4 only exist at some determined locations 8a. Alternatively, the radiation absorbing means 8 may be provided by means of a radiation absorbing layer which is provided on the interior surface of the vapour receiving pipe 4 in an arrangement similar to the emission reducing layer mentioned above. In any case, the radiation absorbing means 8 comprise vapour passage through holes 8b which are aligned with the vapour outlet passages 4b of the vapour receiving pipe 4 to allow the vapour to escape substantially unhindered from the interior of the vapour outlet means 3 of an apparatus according to the invention.

According to an alternative embodiment, the radiation absorbing means 8 may be provided by means of a radiation absorbing pipe which is arranged in the interior of the vapour outlet means 3 in the vicinity of the line shaped heating means 7 and which receives the line shaped heating means in its interior, respectively. Further, the radiation absorbing means 8 may be provided by means of a radiation absorbing layer on the surface of the line-shaped heating means 7, which layer can be a coated layer. According to both alternatives, the radiation absorbing means 8 effectively can absorb the short wavelength IR radiation of the line-shaped heating means and send out long wavelength IR radiation (black body radiation). A short wavelength is a wavelength lower than an upper threshold of between 1 and 4 micrometer, such as below 2 micrometer.

Figure 7:
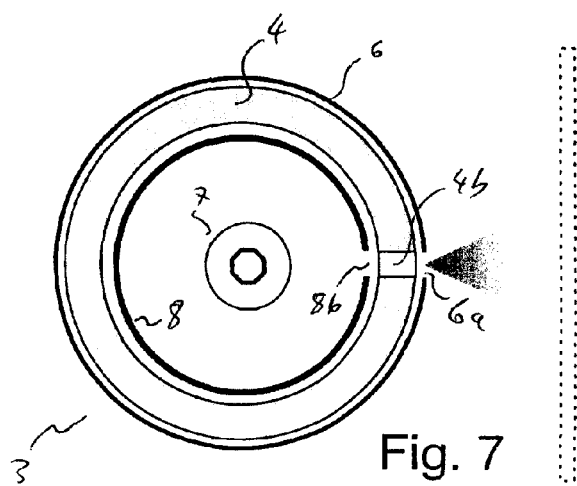
FIG. 7 shows a cross-sectional view of the third embodiment of a thermal vapour deposition apparatus according to the invention.

FIG. 7 shows a cross-sectional view of the vapour outlet means 3 at line A-A shown in FIG. 6. It is apparent from FIG. 7 that the radiation absorbing means 8 are arranged to be surrounded by the vapour receiving pipe 4 and that the vapour outlet passages 4b of the vapour receiving pipe 4 and vapour passage through holes 8a of the radiation absorbing means 8 are arranged to allow the vapour to escape from the interior of the vapour outlet means 3 through said passages. As can be taken from FIG. 7, the radiation absorbing means 8 preferably have a cylindrical cross-section. It is further apparent that in the shown embodiments of the invention the vapour receiving pipe 4, the emission reducing means 6, the line shaped pipe heating means 7 and the radiation absorbing means 8 are arranged concentrically with respect to their longitudinal axes.

Further, according to an advantageous embodiment of the invention, the apparatus comprises a valve means 9, as shown by dashed lines in FIGS. 1, 5 and 6, arranged such that the interior of the vapour outlet means 3 can be shut to stop the evaporation through the vapour receiving pipe.

According to the invention, the valve means 9 consist of a corrosion-resistant material such as the materials mentioned above. Further, according to another advantageous embodiment of the invention, the apparatus comprises cooling means (2a) for fast cooling of the material storage means (1) and the material contained therein. Said cooling means allow for a fast stop of evaporation in case of a machine shut down and maintenance. The coolant can be provided in form of a gas or liquid.

In the embodiments of a thermal evaporation apparatus of the invention discussed so far, the material storage means is arranged to supply said vapour to an end portion of said vapour receiving pipe of said vapour outlet means, in particular to a lower end of an upright vapour receiving pipe.

Figure 8A:
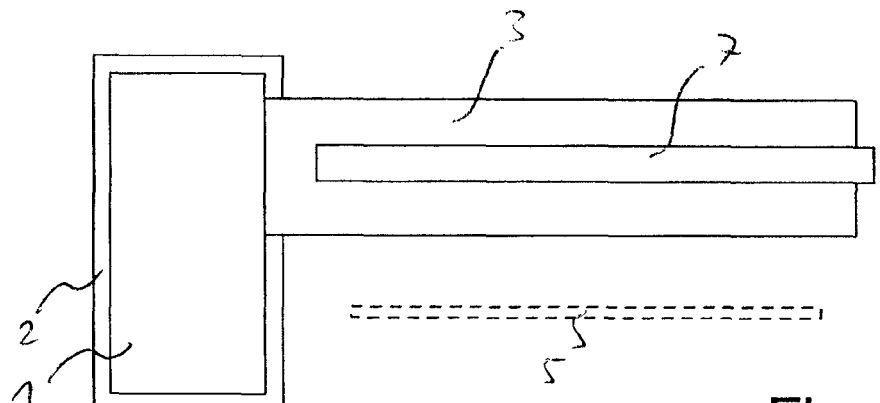
FIGS. 8a to 8c show different arrangements of the vapour outlet means with respect to the material storage means of a thermal vapour deposition apparatus according to the invention.
Figure 8B:
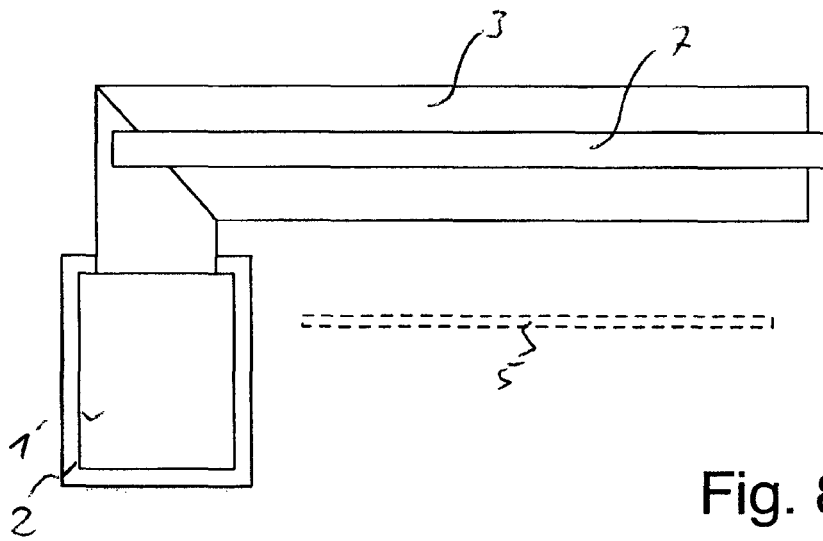
Figure 8C:
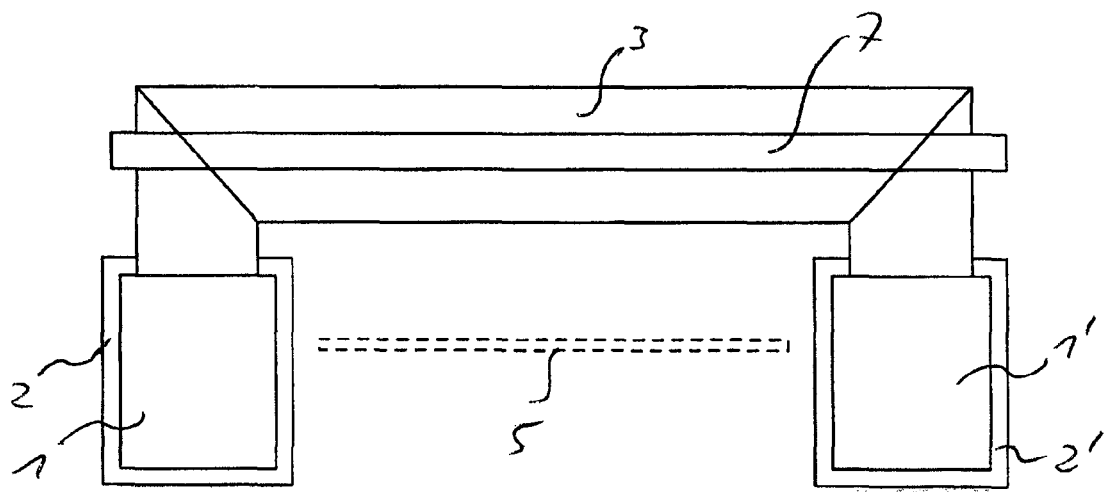

As shown in FIGS. 8a to 8c, which are schematic drawings of embodiments of the invention, it should be noted that the material storage means 1 and the vapour receiving means 3 may be arranged differently from the arrangement shown in FIGS. 1, 5 and 6. As shown in FIG. 8a the vapour outlet means 3 may be arranged at one side of the material storage means 1. As shown in FIG. 8b the vapour outlet means 3 may be bent by any degree, for example by 90°. As shown in FIG. 8c, second material storage means 1' and second heating means 2' may be provided such that the first material storage means 1 and first heating means 2 are arranged at one end of the vapour outlet means 3 and the second material storage means 1' and the second heating means 2' are arranged at the respective other end of the vapour outlet means 3. The position of the substrate 5 is also indicated in FIGS. 8a to 8c. Thus, the second material storage means can be arranged at an end portion of the vapour receiving pipe.

Where reference is made to a corrosion resistant object, surface, or material in the description or in the claims, this can in particular be a non-metallic object, surface, or material. A suitable corrosion-resistant ceramic can be $Al_2O_3$. A measure for corrosion resistance can be the weight increase of a material surface, such as in $mg/cm^2$, in a defined atmosphere of a particular vapour pressure and constitution. For a selenium evaporator, a maximum weight increase of 5 $mg/cm^2$; preferably maximum 1 $mg/cm^2$, is considered sufficiently corrosion resistant after being subjected to a Selenium atmosphere at a temperature between 300 and 600 degrees C. for 10 days. Graphite for example was found to exhibit less than 1 $mg/cm^2$ weight increase. For comparison, several steels that were tested exhibited 10-50 $mg/cm^2$ weight increase.

That which is claimed is:

1. A thermal evaporation apparatus for depositing a material on a substrate, the apparatus comprising:
    material storage means for receiving the material to be deposited, wherein at least the surfaces of the material storage means arranged to come into contact with vapour of the material to be deposited are constructed of a material selected from the group consisting of quartz, fused silica, ceramic, graphite and carbon-fibre-enforced-carbon (CFC);
    heating means for heating the material in the material storage means to generate a vapour;
    vapour outlet means arranged to receive in its interior said vapour, said vapour outlet means comprising:
        a vapour receiving pipe having vapour outlet passages, wherein at least the surfaces of the vapour receiving pipe arranged to come into contact with the vapour are constructed of a material selected from the group consisting of quartz, fused silica, ceramic, graphite and carbon-fibre-enforced-carbon (CFC), and
        emission reducing means arranged such that an external surface of the vapour outlet means directed to said substrate exhibits emissivity of 0.6 or less, wherein at least the surfaces of the emission reducing means arranged to come into contact with the vapour are constructed of a material selected from the group consisting of quartz, fused silica, ceramic, graphite and carbon-fibre-enforced-carbon (CFC), and wherein the apparatus further comprises
    line shaped pipe heating means arranged in the interior of said vapour outlet means and extending along or in parallel with a longitudinal axis of said vapour receiving pipe, said pipe heating means being provided with an outer corrosion-resistant surface arranged to come into contact with the material vapour and being formed of a material selected from the group consisting of quartz, fused silica, ceramic, and graphite.

2. The thermal evaporation apparatus according to claim 1, wherein said emission reducing means is an emission reducing pipe accommodating said vapour receiving pipe in its interior wherein said emission reducing pipe comprises at least one of a vapour passage through holes or a vapour passage slit, being aligned with said vapour outlet passages of said vapour receiving pipe.

3. The thermal evaporation apparatus according to claim 1, wherein said emission reducing means is an emission reducing layer on an external surface of said vapour receiving pipe, said layer being arranged at least on a surface portion of said vapour receiving pipe facing said substrate.

4. The thermal evaporation apparatus according to claim 1, further comprising radiation absorbing means comprising corrosion-resistant surfaces arranged to come into contact with the vapour, the corrosion-resistant surfaces being constructed of a material selected from the group consisting of quartz, fused silica, ceramic, graphite and carbon-fibre-enforced-carbon (CFC), for absorbing radiation emitted by said line shaped pipe heating means, wherein said radiation absorbing means is one of a radiation absorbing pipe provided in said vapour receiving pipe or a radiation absorbing layer provided on an interior surface of said vapour receiving pipe.

5. The thermal evaporation apparatus according to claim 1, wherein said pipe heating means comprise a heating element and a heating element bulb housing the heating element such that only the surface of the heating element bulb faces the interior of said vapour receiving pipe.

6. The thermal evaporation apparatus according to claim 1, further comprising valve means arranged to control fluid passage through said vapour receiving pipe, said valve means comprising corrosion-resistant surfaces arranged to come into contact with the material vapour, the corrosion-resistant surfaces being constructed of a material selected from the group consisting of quartz, fused silica, ceramic, graphite and carbon-fibre-enforced-carbon (CFC).

7. The thermal evaporation apparatus according to claim 1, further comprising cooling means for cooling the material storage means.

8. The thermal evaporation apparatus according to claim 1, wherein the vapour receiving pipe and/or the emission reducing means provide the vapour outlet means with sufficient gastightness such that a desired gas pressure is obtained when the material is heated in the materials storage means.

9. A thermal evaporation apparatus for depositing a material on a substrate comprising
material storage means for receiving the material to be deposited, said material storage means being constructed of a material selected from the group consisting of quartz, fused silica, ceramic, graphite and carbon-fibre-enforced-carbon (CFC);
heating means for heating the material in the material storage means to generate a vapour of the material;
vapour outlet means arranged to receive in its interior the vapour of the material heated in said material storage means and having vapour outlet passages, wherein said vapour outlet means comprises a material selected from the group consisting of quartz, fused silica, ceramic, graphite and carbon-fibre-enforced-carbon (CFC) and wherein said vapour outlet means are gastight to such an extent that sufficient dynamic pressure of said material vapour is achievable for homogenous deposition of said material on said substrate, and wherein 75% or more of said material vapour exit the vapour outlet means through said vapour outlet passages; and
line shaped pipe heating means arranged in the interior of said vapour outlet means and extending along or in parallel with a longitudinal axis of a vapour receiving pipe, said pipe heating means being provided with an outer corrosion-resistant surface arranged to come onto contact with the material vapour and being formed of a material selected from the group consisting of quartz, fused silica, ceramic, and graphite.

* * * * *

UNITED STATES PATENT AND TRADEMARK OFFICE
CERTIFICATE OF CORRECTION

PATENT NO. : 8,082,878 B2
APPLICATION NO. : 12/297527
DATED : December 27, 2011
INVENTOR(S) : Volker Probst and Walter Stetter It is certified that error appears in the above-identified patent and that said Letters Patent is hereby corrected as shown below:

Column 1, line 7, the word "US" should be removed.

Signed and Sealed this
Tenth Day of April, 2012

David J. Kappos
*Director of the United States Patent and Trademark Office*